US009508786B2

(12) United States Patent
Chung et al.

(10) Patent No.: US 9,508,786 B2
(45) Date of Patent: Nov. 29, 2016

(54) INTEGRATED CIRCUITS AND FABRICATION METHODS THEREOF

(71) Applicant: MediaTek Inc., Hsin-Chu (TW)

(72) Inventors: Yuan-Fu Chung, Changhua County (TW); Chu-Wei Hu, Zhubei (TW); Yuan-Hung Chung, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/886,221

(22) Filed: Oct. 19, 2015

(65) Prior Publication Data

US 2016/0043162 A1 Feb. 11, 2016

Related U.S. Application Data

(62) Division of application No. 14/557,743, filed on Dec. 2, 2014, now Pat. No. 9,379,175.

(60) Provisional application No. 61/920,851, filed on Dec. 26, 2013.

(51) Int. Cl.
*H01L 21/8234* (2006.01)
*H01L 21/8244* (2006.01)
(Continued)

(52) U.S. Cl.
CPC ......... *H01L 28/20* (2013.01); *H01L 21/02532* (2013.01); *H01L 21/02595* (2013.01); *H01L 21/265* (2013.01); *H01L 21/266* (2013.01); *H01L 21/268* (2013.01); *H01L 21/26506* (2013.01); *H01L 21/26513* (2013.01); *H01L 21/28035* (2013.01); *H01L 21/324* (2013.01); *H01L 21/76224* (2013.01); *H01L 21/8234* (2013.01); *H01L 21/823437* (2013.01); *H01L 27/0629* (2013.01); *H01L 29/0649* (2013.01); *H01L 29/0653* (2013.01); *H01L 29/167* (2013.01); *H01L 29/4916* (2013.01); *H01L 27/0207* (2013.01)

(58) Field of Classification Search
None
See application file for complete search history.

(56) References Cited

U.S. PATENT DOCUMENTS

| 5,600,154 | A | 2/1997 | Shimizu et al. |
| 2002/0123202 | A1 | 9/2002 | Amishiro et al. |
| 2003/0071312 | A1 | 4/2003 | Oana et al. |
| 2003/0216013 | A1* | 11/2003 | Geiss ................ H01L 21/26506 438/488 |

(Continued)

FOREIGN PATENT DOCUMENTS

EP 0622832 A2 11/1994

*Primary Examiner* — Sonya D McCall Shepard
(74) *Attorney, Agent, or Firm* — McClure, Qualey & Rodack, LLP

(57) ABSTRACT

A method of fabricating an integrated circuit is also provided. The method includes forming a first polysilicon region having an initial grain size on a substrate. The first polysilicon region is implanted with a first dopant of a first conductivity type and a second dopant. After the implantation, the first polysilicon region has a first grain size larger than the initial grain size. Then, a laser rapid thermal annealing process is performed to the first polysilicon region.

15 Claims, 3 Drawing Sheets

(51) Int. Cl.

| | |
|---|---|
| *H01L 49/02* | (2006.01) |
| *H01L 21/265* | (2006.01) |
| *H01L 21/268* | (2006.01) |
| *H01L 21/28* | (2006.01) |
| *H01L 21/324* | (2006.01) |
| *H01L 27/06* | (2006.01) |
| *H01L 21/762* | (2006.01) |
| *H01L 29/06* | (2006.01) |
| *H01L 29/49* | (2006.01) |
| *H01L 21/02* | (2006.01) |
| *H01L 21/266* | (2006.01) |
| *H01L 29/167* | (2006.01) |
| *H01L 27/02* | (2006.01) |

(56) References Cited

U.S. PATENT DOCUMENTS

| | | |
|---|---|---|
| 2003/0222277 A1 | 12/2003 | Fujii |
| 2004/0248358 A1* | 12/2004 | Komori ............... H01L 27/0629 438/238 |
| 2006/0017117 A1* | 1/2006 | Kotani ............ H01L 21/823412 257/379 |
| 2007/0108529 A1 | 5/2007 | Huang et al. |
| 2012/0049291 A1* | 3/2012 | Scheiper ............. H01L 27/0629 257/380 |
| 2012/0181612 A1 | 7/2012 | Yang et al. |
| 2013/0093472 A1 | 4/2013 | Lee et al. |
| 2013/0149849 A1* | 6/2013 | Nandakumar .... H01L 21/26513 438/532 |
| 2013/0203226 A1 | 8/2013 | Yang et al. |

* cited by examiner

INTEGRATED CIRCUITS AND FABRICATION METHODS THEREOF

CROSS REFERENCE TO RELATED APPLICATIONS

This application is a division of U.S. application Ser. No. 14/557,743, filed Dec. 2, 2014, now U.S. Pat. No. 9,379,175, which claims the benefit of U.S. Provisional Application No. 61/920,851, filed on Dec. 26, 2013, the entirety of which is incorporated by reference herein.

BACKGROUND OF THE INVENTION

1. Field of the Invention

The invention relates to integrated circuits and more particularly to a method of fabricating polysilicon resistors to improve resistance mismatch between the polysilicon resistors in an integrated circuit and an integrated circuit fabricated by the method.

2. Description of the Related Art

Integrated circuits are manufactured using a wide variety of well-known techniques. In the manufacturing of integrated circuits, active and passive components are formed on a semiconductor substrate such as a silicon wafer, and then interconnected in a desired manner.

Resistors are typically formed in a semiconductor substrate using one or two well-known techniques. In the first technique, regions of the semiconductor substrate are doped with n-type or p-type dopants. This provides conductive regions in the semiconductor substrate having a desired resistivity. By forming ohmic contacts to a pair of spaced-apart locations in the conductive regions, a diffused region is provided. Such resistors are referred to as diffused resistors.

In the second technique, an insulator layer, i.e. dielectric layer, is formed on the surface of a semiconductor substrate. Next, a layer of polysilicon is formed on the insulator layer. The polysilicon layer is doped with n-type or p-type dopant. The dopants form a conductive region having a desired resistivity. Next, ohmic connections are formed on a pair of spaced-apart regions on the polysilicon layer to complete the resistor. The resistors are referred to as polysilicon resistors.

Integrated circuit fabricating processes include annealing operations to perform various function, including activation of dopants and reduction of crystal lattice damage from ion implantation. Laser scan annealing is an annealing technique that has advantages over other annealing techniques, such as conventional rapid thermal annealing, flash annealing or furnace annealing, which is used in old process node, such as the 100 nm node. Laser scan annealing is being used more frequently in advanced process nodes, such as a 65 nm node and beyond. However, defect mechanisms unique to laser scan annealing have been observed.

BRIEF SUMMARY OF THE INVENTION

The disclosure provides a method of fabricating polysilicon resistors in an integrated circuit. The method can overcome resistance mismatch between the polysilicon resistors at different locations of the integrated circuit. The resistance mismatch between the polysilicon resistors is induced by a laser rapid thermal annealing process, i.e. a laser scan annealing, which is used for activation of dopants in the polysilicon resistors. The disclosure also provides an integrated circuit including the polysilicon resistors fabricated by the method.

In embodiments of the disclosure, furthermore, a method of fabricating an integrated circuit is provided. The method includes forming a first polysilicon region, having an initial grain size, on a substrate. The method also includes implanting the first polysilicon region with a first dopant of a first conductivity type and a second dopant. After the implanting, the first polysilicon region has a first grain size greater than the initial grain size. The method further includes performing a laser rapid thermal annealing process to the first polysilicon region.

In embodiments of the disclosure, furthermore, a method of fabricating an integrated circuit is provided. The method includes forming a first polysilicon region containing a plurality of polysilicon resistor bodies on a substrate. The polysilicon resistor bodies have an initial grain size. The polysilicon resistor bodies surround an active component area. The method also includes implanting the polysilicon resistor bodies with a first dopant of a first conductivity type and a second dopant. After the implanting, the polysilicon resistor bodies have a first grain size larger than the initial grain size. The method further includes performing a laser rapid thermal annealing process to the polysilicon resistor bodies by moving a laser beam in a laser scan direction perpendicular to a first lateral side and a second lateral side of the active component area.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
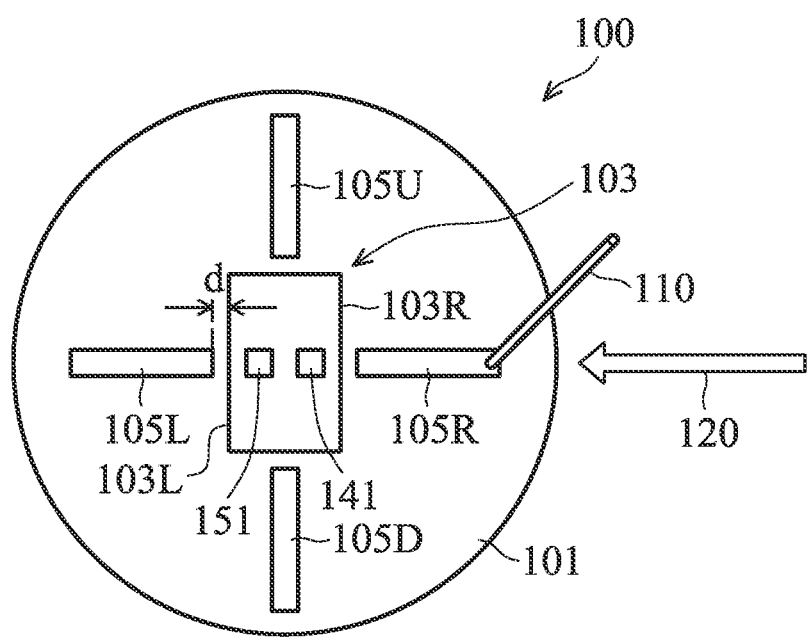
FIG. 1 shows a schematic partial plane view of fabricating an integrated circuit during a laser rapid thermal annealing process according to some embodiments.

Referring to FIG. 1, a partial plane view of fabricating an integrated circuit 100 during a laser rapid thermal annealing process according to some embodiments is shown. The integrated circuit 100 includes active and passive components formed on a semiconductor substrate 101 such as a silicon wafer. The active components are formed in an active component area 103. The passive components such as polysilicon resistors 105R, 105L, 105U and 105D are formed to surround the active component area 103. For example, the polysilicon resistors 105R, 105L, 105U and 105D are respectively formed on the right, left, up and down sides of the active component area 103.

The polysilicon resistors 105R, 105L, 105U and 105D are formed by depositing a polysilicon layer over the semiconductor substrate 101 and then the polysilicon layer is patterned by a photolithography and etching process to form polysilicon resistor bodies. The polysilicon resistor bodies are doped with dopants of a first conductive type, such as n-type or p-type. In some embodiments, the polysilicon resistor bodies are heavily doped with p-type dopants for forming p+ type polysilicon resistors. For example, the polysilicon resistor bodies are doped with boron at a dose of $1E15/cm^2$.

The dopants in the polysilicon resistor bodies are activated by using a laser rapid thermal annealing process, i.e. laser scan annealing, to form p+ type polysilicon resistors 105R, 105L, 105U and 105D. Laser scan annealing involves irradiating a small region of the integrated circuit surface with a laser beam 110 while scanning the irradiated region in a laser scan direction 120 over the whole surface of the semiconductor substrate 101. In some embodiments, the laser scan direction 120 is perpendicular to the right side 103R and the left side 103L of the active component area 103.

Figure 2:
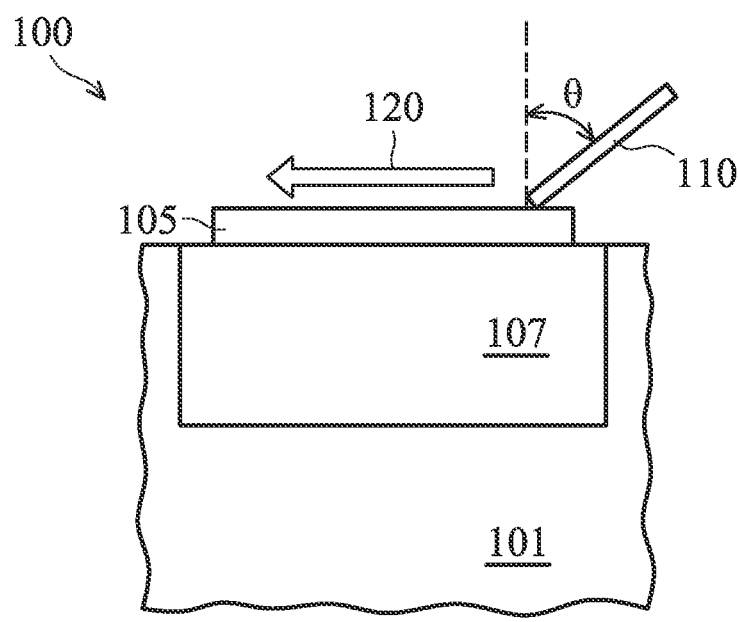
FIG. 2 shows a schematic partial cross section of an integrated circuit according to some embodiments, in which a polysilicon region is irradiated by a laser beam during a laser rapid thermal annealing process.

Referring to FIG. 2, a partial cross section of an integrated circuit 100 according to some embodiments is shown, in which a polysilicon region 105 is irradiated by a laser beam 110 during a laser rapid thermal annealing process. The polysilicon region 105, for example a polysilicon resistor, is formed on a dielectric layer 107 in the semiconductor substrate 101. In some embodiments, the dielectric layer 107 is a filed oxide layer formed by a shallow trench isolation (STI) process. Thus, the dielectric layer 107 is referred to as a STI structure. As shown in FIG. 2, the polysilicon region 105 is irradiated by the laser beam 110 in a laser scan direction 120 to activate dopants in the polysilicon region 105. The laser beam 110 is configured at an angle θ greater than 0 degrees from vertical and less than 90 degrees from vertical, typically approximately 70 to 75 degrees from vertical, where the top surface of the polysilicon region 105 is considered to be horizontal. The degrees range of the angle θ can enhance power transfer efficiency from the laser beam 110 to the polysilicon region 105.

The polysilicon region 105 is scanned by the laser beam 110 in the laser scan direction 120 across the whole top surface of the semiconductor substrate 101. Referring to FIG. 1 again, the polysilicon bodies of all polysilicon resistors 105R, 105L, 105U and 105D are scanned by the laser beam 110 in the same laser scan direction 120 during the laser rapid thermal annealing process. While the polysilicon bodies of the polysilicon resistors 105R, 105U and 105D are scanned by the laser beam 110 in the laser scan direction 120, the active component area 103 would not affect the heating of the laser beam 110. However, while the polysilicon body of the polysilicon resistor 105L on the left side of the active component area 103 is scanned by the laser beam 110 in the same laser scan direction 120, the active component area 103 will affect the heating of the laser beam 110 and excess heat energy is accumulated on the polysilicon resistor 105L. The excess heating causes the resistance of the polysilicon resistor 105L to be lowered. Thus, resistance mismatch between the polysilicon resistors 105R, 105L, 105U and 105D at different locations of the integrated circuit 100 is induced by the laser rapid thermal annealing process. In some conditions, the resistance of the polysilicon resistor 105L is 10% lower than that of the other polysilicon resistors 105R, 105U and 105D.

The resistance mismatch between the polysilicon resistors will degrade the performance of an integrated circuit, partially in I-Q mismatch of radio frequency (RF) transceivers and biasing point accuracy in most analog circuits. While the distance d between the polysilicon resistor 105L and the active component area 103 is increased, the influence of the active component area 103 to the heating of laser rapid thermal annealing process is reduced. Thus, the resistance of the polysilicon resistor 105L is improved. In addition, decreasing the density of active component areas 103 in a wafer can also improve the resistance of the polysilicon resistor 105L. In other words, increasing the distance d between the polysilicon resistor 105L and the active component area 103 and decreasing the density of active component areas 103 in a wafer can improve the resistance mismatch between the polysilicon resistors 105R, 105L, 105U and 105D. However, the above mentioned methods will increase the area of the layout of the integrated circuit by 5%-10%.

Another method for improving resistance mismatch between the polysilicon resistors 105R, 105L, 105U and 105D is to fine-tune an orientation of a laser rapid thermal annealing process, i.e. a laser scan direction, on the wafer. However, it is difficult to find a single orientation of laser scan direction on the wafer for all integrated circuits to improve resistance mismatch between the polysilicon resistors.

Therefore, the disclosure provides a method of fabricating polysilicon resistors which can improve resistance mismatch between the polysilicon resistors without increasing the distance d between the polysilicon resistor 105L and the active component area 103, decreasing the density of the active component areas 103 in a wafer and changing an orientation of a laser rapid thermal annealing process, i.e. the laser scan direction 120, on the wafer. According to some embodiments of the disclosure, polysilicon bodies of the polysilicon resistors are doped with first dopants of first conductive type, such as n-type or p-type. Moreover, the polysilicon bodies of the polysilicon resistors are further doped with second dopants selected from elements of group IIIA and group IVA which has an atomic weight heavier than that of silicon. The polysilicon resistor bodies doped with the first and second dopants have a grain size larger than an initial grain size of the polysilicon resistor bodies and the polysilicon resistor bodies only doped with the first dopants. Next, a laser rapid thermal annealing process is performed on the polysilicon resistor bodies to activate the first and second dopants therein and then the polysilicon resistors are formed.

The polysilicon resistor bodies having a large grain size can effectively lower the dopants activation energy and thereby lower thermal budget required for the polysilicon resistors, particularly in the embodiments of using a laser rapid thermal annealing in an advanced process node, such as a 65 nm node and beyond. The low thermal budget results in lower thermal sensitivity of the polysilicon resistors. Thus, the resistances of the polysilicon resistors at different locations of an integrated circuit are consistent with each other while performing the laser rapid thermal annealing process. In other words, implanting the second dopants into the polysilicon resistor bodies can effectively improve resistance mismatch between the polysilicon resistors induced by a laser rapid thermal annealing process.

Figure 3A:
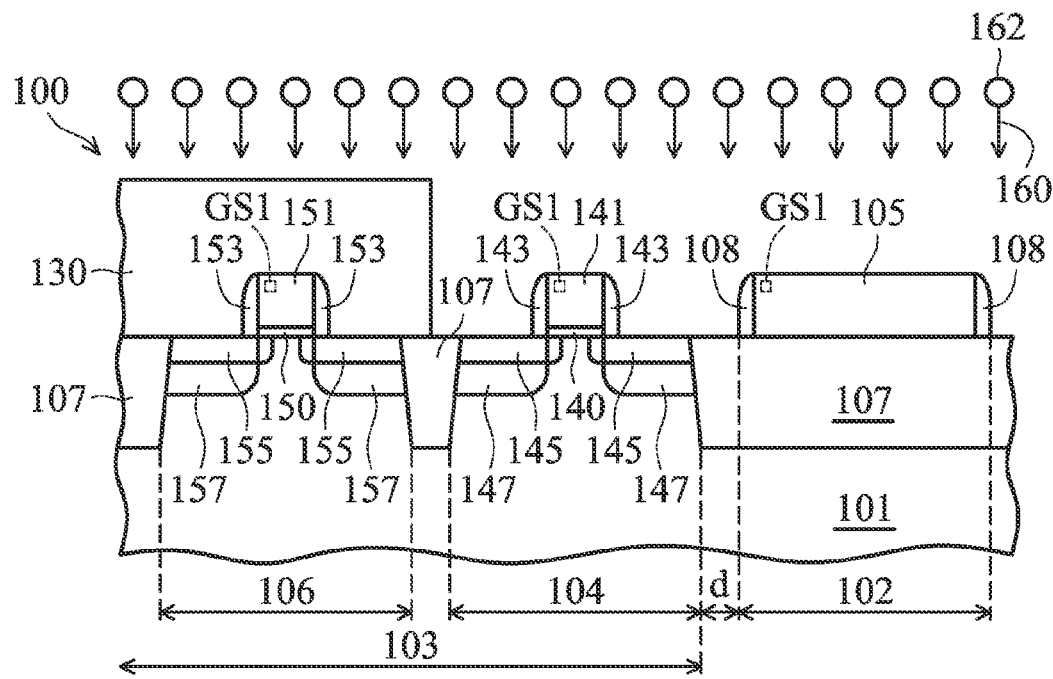
FIGS. 3A-3D shows schematic partial cross sections of several intermediate stages of fabricating an integrated circuit according to some embodiments.

FIGS. 3A-3D are partial cross sections of several intermediate stages of fabricating an integrated circuit 100 in accordance with some embodiments. Referring to FIG. 3A, the integrated circuit 100 is formed in and on a semiconductor substrate 101, for example silicon wafer, silicon-on-insulator (SOI) substrate, or other suitable semiconductor substrates. In some embodiments, the integrated circuit 100 includes an n-channel metal oxide semiconductor (NMOS) area 106 for an NMOS transistor and a p-channel metal oxide semiconductor (PMOS) area 104 for a PMOS transistor. The NMOS area 106 and the PMOS area 104 are disposed in the active component area 103 as shown in FIG. 1. The integrated circuit 100 further includes a passive component area 102 for polysilicon resistors, such as the polysilicon resistors 105R, 105L, 105U and 105D as shown in FIG. 1.

A dielectric layer 107, for example a field oxide layer formed by a shallow trench isolation (STI) process is formed in the semiconductor substrate 101 to isolate the NMOS area 106 from the PMOS area 104. The dielectric layer 107 is referred to as an STI structure. Furthermore, the STI structure 107 is also formed in the passive component area 102 under the polysilicon resistors 105R, 105L, 105U and 105D as shown in FIG. 1.

The NMOS area 106 includes a gate dielectric layer 150, a polysilicon gate 151, gate sidewall spacers 153, n-channel lightly doped regions 155 and n-channel heavily doped regions 157. The PMOS area 104 includes a gate dielectric layer 140, a polysilicon gate 141, gate sidewall spacers 143, p-channel lightly doped regions 145 and p-channel heavily doped regions 147. The passive component area 102 includes a polysilicon resistor body 105 and sidewall spacers 108 on the polysilicon resistor body 105. FIG. 3A only shows one polysilicon resistor body 105 in the passive component area 102 for simplifying the drawing. Actually, there is a plurality of polysilicon resistor bodies formed in the passive component area 102, for example polysilicon resistor bodies of the polysilicon resistors 105R, 105L, 105U and 105D as shown in FIG. 1.

In some embodiments, the polysilicon gate 151, the polysilicon gate 141 and the polysilicon resistor body 105 are formed concurrently by depositing a polysilicon film on the semiconductor substrate 101 and then patterning the polysilicon film by a photolithography and etching process. The polysilicon gate 151, the polysilicon gate 141 and the polysilicon resistor body 105 have the same grain size GS1. In some embodiments, the grain size GS1 is in a range of 60 Å to 70 Å. Furthermore, the gate sidewall spacers 153, the gate sidewall spacers 143 and the sidewall spacers 108 are also formed concurrently by depositing a dielectric material layer, for example silicon oxide, silicon nitride or a combination thereof, and then patterning the dielectric material layer by a photolithography and etching process.

In some embodiments, the polysilicon resistor body 105 is heavily doped with dopants of a first conductivity type, for example p-type, for forming a p+ type polysilicon resistor. A first mask 130 for implanting p-type dopants is formed over a top surface of the integrated circuit 100 to expose the PMOS area 104 and the passive component area 102 and cover the NMOS area 106. The first mask 130 can be a photoresist formed by a photolithography process. An implantation process 160 is performed to implant p-type dopants 162, for example boron, into the polysilicon gate 141 in the PMOS area 104 and the polysilicon resistor body 105 in the passive component area 102. In some embodiments, a dose of the p-type dopants 162 in the implantation process 160 is $1E15/cm^2$.

Figure 3B:
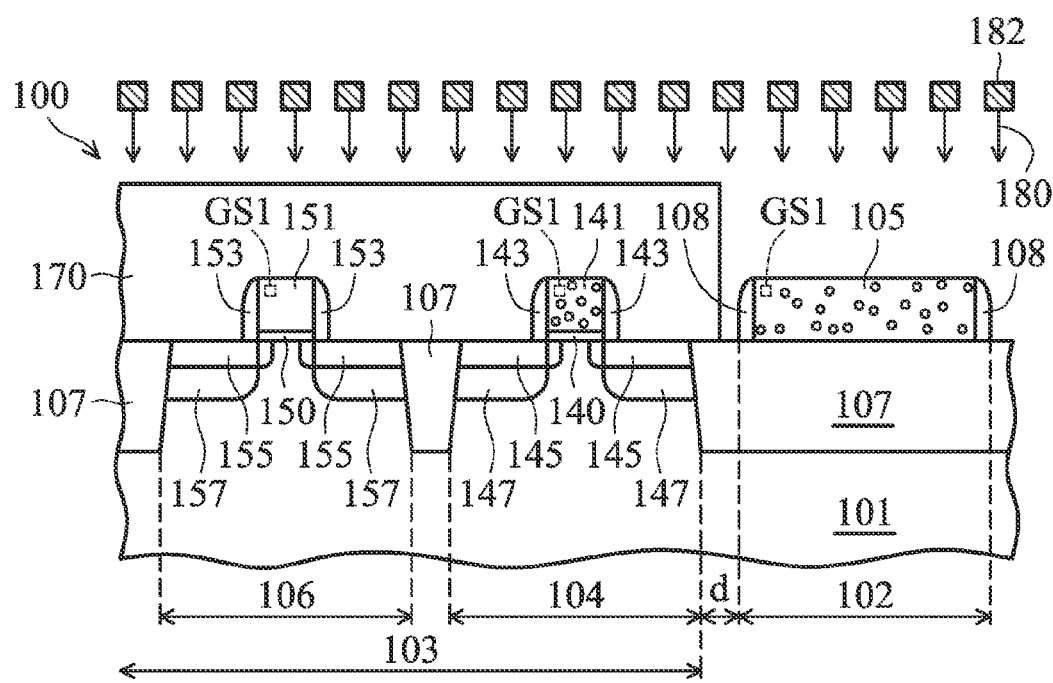

Referring to FIG. 3B, after the implantation process 160, the first mask 130 is removed. A second mask 170 for implanting second dopants is formed over a top surface of the integrated circuit 100 to expose the passive component area 102 and cover the NMOS area 106 and the PMOS area 104. The second mask 170 can be a photoresist formed by a photolithography process. An implantation process 180 is performed to implant second dopants 182 into the polysilicon resistor body 105 in the passive component area 102.

According to the embodiments of the disclosure, the second dopants 182 are selected from elements of group IIIA and group IVA which have an atomic weight heavier than that of silicon, for example germanium (Ge), tin (Sn), plumbum (Pb), gallium (Ga), indium (In) or titanium (Ti). In some embodiments, the second dopants 182 are selected from Ge, Ga and In. In some embodiments, the implantation process 180 is performed to implant the second dopants 182 of Ge into the polysilicon resistor body 105 with a dose of $2E14/cm^2$ to $1E15/cm^2$ at an energy level of greater than 30 KeV. For example, in an embodiment, the implantation process 180 is performed to implant Ge into the polysilicon resistor body 105 with a dose of $5E14/cm^2$ at an energy level of equal to or greater than 50 KeV.

While the implantation process 180 is performed at a high energy level such as 50 KeV to implant the second dopants 182 into the polysilicon resistor body 105, a large grain size of the polysilicon resistor body 105 is obtained. In a result, a grain size of the polysilicon resistor body is increased of about 1.1 Å by 1 KeV. The polysilicon resistor body having a large grain size can effectively lower the dopants activation energy and thereby lower thermal budget for the polysilicon resistors in a subsequent laser rapid thermal annealing process. The low thermal budget results in lower thermal sensitivity of the polysilicon resistor bodies. Therefore, an implantation process 180 performed at an energy level equal to or greater than 50 KeV can more effectively improve resistance mismatch between the polysilicon resistors than an implantation process 180 performed at an energy level of 30 KeV.

In some embodiments, the difference in resistance between the right and left polysilicon resistors 105R and 105L as shown in FIG. 1 is less than 4% while the implantation process 180 is performed at an energy level of 30 KeV. In some other embodiments, the difference in resistance between the right and left polysilicon resistors 105R and 105L as shown in FIG. 1 is less than 2% while the implantation process 180 is performed at an energy level of 50 KeV.

Figure 3C:
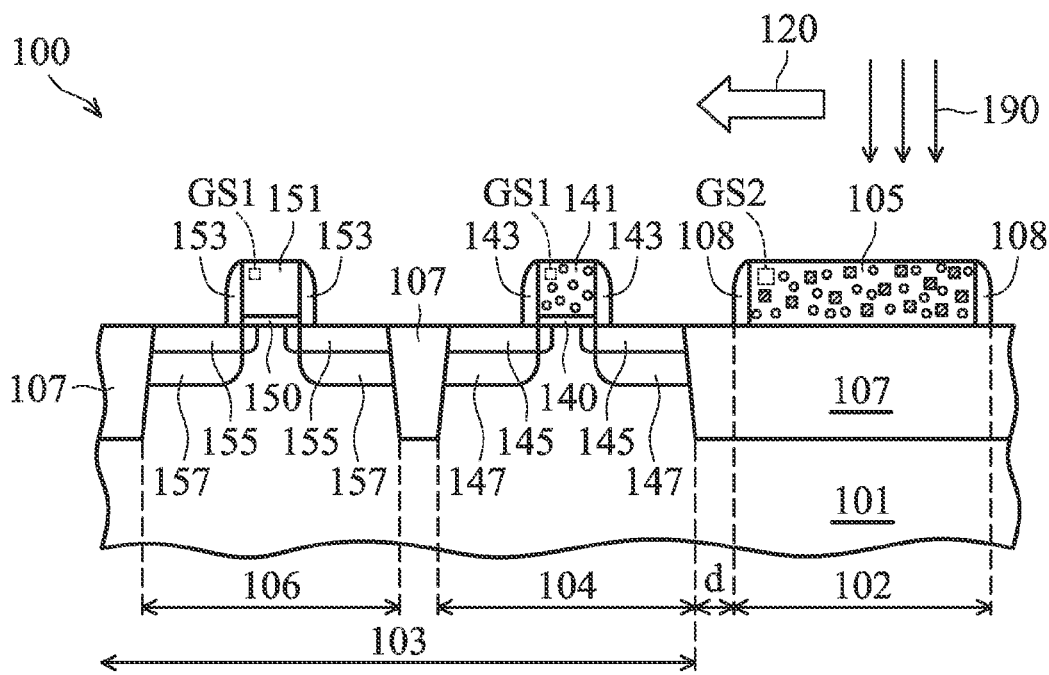

Referring to FIG. 3C, after the implantation process 180, the second mask 170 is removed. The polysilicon resistor body 105, doped with the first dopants 162 and the second dopants 182 therein, has a grain size GS2 which is larger than the grain size GS1. In some embodiments, the grain size GS2 is in a range of 110 Å to 120 Å. Then, a laser rapid thermal annealing process 190 is performed on the integrated circuit 100. During the laser rapid thermal annealing process 190, a top surface of the integrated circuit 100 is scanned by a laser beam in the laser scan direction 120 to activate the dopants in the polysilicon gate 141 and the polysilicon resistor body 105.

Figure 3D:
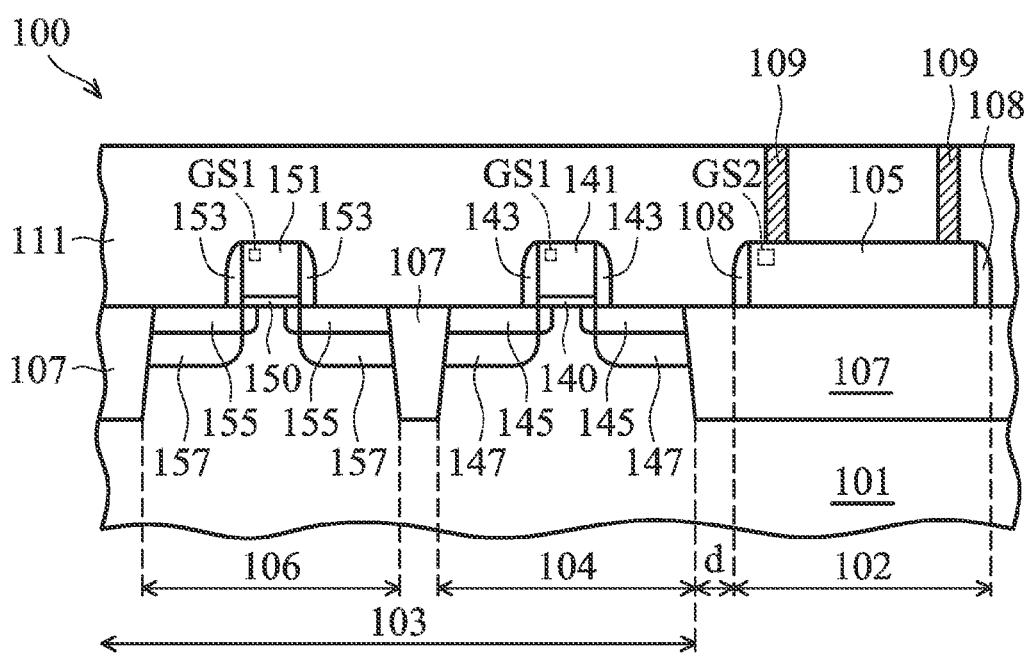

Referring to FIG. 3D, after the laser rapid thermal annealing process 190, the dopants 162 of the first conductivity type in the polysilicon gate 141 are activated. Moreover, the dopants 162 of the first conductivity type and the second dopants 182 in the polysilicon resistor body 105 are also activated. At the same time, dopants in other polysilicon resistors bodies, for example polysilicon resistors bodies of the polysilicon resistors 105L, 105U and 105D in the integrated circuit 100 are also activated. Then, an dielectric layer 111 is formed over the top surface of the integrated circuit 100 to cover the NMOS and PMOS transistors and the polysilicon resistor body 105. Next, contacts 109 are formed in the dielectric layer 111 at a pair of spaced-apart regions on the polysilicon resistor body 105 to complete the polysilicon resistor.

In some embodiments, the polysilicon gate 151 of the NMOS transistor has a grain size SG1 which is not changed at the several intermediate stages of fabricating the integrated circuit 100 as shown in FIGS. 3A to 3D. The polysilicon gate 141 of the PMOS transistor also has the grain size SG1 which is not changed at the several intermediate stages of fabricating the integrated circuit 100 as shown in FIGS. 3A to 3D. The initial polysilicon resistor body 105 and the polysilicon resistor body 105 doped with the first dopants 162 also have the grain size SG1 at the stages of fabricating the integrated circuit 100 as shown in FIGS. 3A and 3B. The grain size SG1 of the polysilicon resistor body 105 is the same as that of the polysilicon gates 141 and 151 of the PMOS and NMOS transistors. In some embodiments, the polysilicon grain size SG1 is in a range of 60 Å to 70 Å. However, the polysilicon resistor body 105 has a grain size SG2 at the stages of fabricating the integrated circuit 100 as shown in FIGS. 3C and 3D. In some embodiments, the grain size SG2 is in a range of 110 Å to 120 Å.

According to the embodiments of the disclosure, the integrated circuit 100 includes a first polysilicon region containing the polysilicon resistor 105 which has the grain size SG2 different from and greater than the grain size SG1 of the polysilicon gates 141 and 151 of the PMOS and NMOS transistors in a second polysilicon region. The first polysilicon region is a portion of a passive component and the second polysilicon region is a portion of an active component.

In addition, the first polysilicon region includes a plurality of polysilicon resistors, having the grain size SG2, formed on the semiconductor substrate in a passive component area. The second polysilicon region includes a plurality of polysilicon gates, having the grain size SG1 different from the grain size SG2, formed on the semiconductor substrate in an active component area. The grain size SG2 is greater than the grain size SG1. The polysilicon resistors surround the active component area. The polysilicon resistors disposed at different sides of the active component area have resistances consistent with each other.

According to the embodiments of the disclosure, the polysilicon resistors have a p-type first dopant and a second dopant therein. The second dopant is selected from elements of group IIIA and group IVA which has an atomic weight heavier than that of silicon. The polysilicon resistors with the second dopant implanting therein have a large grain size SG2 which can effectively lower the dopants activation energy. The thermal budget for the polysilicon resistors is thereby lowered, particularly in the embodiments of using a laser rapid thermal annealing in advanced process node, such as 65 nm node and beyond. The low thermal budget results in lower thermal sensitivity of all polysilicon resistor bodies. Thus, resistances of the polysilicon resistors at different locations of the integrated circuit are consistent with each other while performing the laser rapid thermal annealing process on the polysilicon resistor bodies. Therefore, the implantation of the second dopants into the polysilicon resistor bodies can effectively improve resistance mismatch between the polysilicon resistors induced by laser rapid thermal annealing process.

Compared with polysilicon resistor bodies of an integrated circuit without implanting the second dopants, the embodiments of the disclosure implanting the second dopants into the polysilicon resistor bodies at an energy level of 50 KeV or greater than 50 KeV can improve resistance mismatch between the polysilicon resistors by 4 to 6 times under the same density of active component area and the same distance from the polysilicon resistor to the active component area. Therefore, the disclosure can relax the requirements for the density of the active component area and the distance from the polysilicon resistor to the active component area. It is beneficial for the analog circuit to achieve a smaller area of the layout of the integrated circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating an integrated circuit, comprising:

forming a first polysilicon region having an initial grain size on a substrate;

forming a second polysilicon region having the initial grain size on the substrate;

implanting the first polysilicon region with a first dopant of a first conductivity type and a second dopant and implanting the second polysilicon region with the first dopant of the first conductivity type, after the implanting, the first polysilicon region having a first grain size greater than the initial grain size and the second polysilicon region having a second grain size equal to the initial grain size; and performing a laser rapid thermal annealing process to the first polysilicon region and the second polysilicon region.

2. The method as claimed in claim 1, wherein the first dopant includes a p-type dopant and the second dopant is selected from a group consisting of group IIIA and group IVA elements which have an atomic weight heavier than that of silicon.

3. The method as claimed in claim 2, wherein the second dopant includes germanium, gallium or indium.

4. The method as claimed in claim 2, wherein implanting the second dopant into the first polysilicon region with a dose of $2E14/cm^2$ to $1E15/cm^2$ at an energy level of greater than 30 KeV.

5. The method as claimed in claim 2, wherein implanting the second dopant into the first polysilicon region with a dose of $5E14/cm^2$ at an energy level equal to or greater than 50 KeV.

6. The method as claimed in claim 1, wherein the first polysilicon region includes a polysilicon resistor formed in a passive component area and the second polysilicon region includes a polysilicon gate formed in an active component area.

7. The method as claimed in claim 1, further comprising:

forming a first mask to expose the first and second polysilicon regions for implanting the first dopant into the first and second polysilicon regions; and forming a second mask to expose the first polysilicon region and cover the second polysilicon region for implanting the second dopant into the first polysilicon region.

8. The method as claimed in claim 7, further comprising forming a shallow trench isolation structure in the substrate, wherein the first polysilicon region is formed on the shallow trench isolation structure.

9. A method of fabricating an integrated circuit, comprising:

forming a first polysilicon region including a plurality of polysilicon resistor bodies on a substrate, wherein the polysilicon resistor bodies have an initial grain size and the polysilicon resistor bodies surround an active component area;

implanting the polysilicon resistor bodies with a first dopant of a first conductivity type and a second dopant, after the implanting, the polysilicon resistor bodies having a first grain size larger than the initial grain size; and performing a laser rapid thermal annealing process to the polysilicon resistor bodies by moving a laser beam in a laser scan direction perpendicular to a first lateral side and a second lateral side of the active component area.

10. The method as claimed in claim 9, wherein the laser beam irradiates a first polysilicon resistor body adjacent to the first lateral side of the active component area followed by irradiating a second polysilicon resistor body adjacent to the second lateral side of the active component area in the laser scan direction.

11. The method as claimed in claim 10, wherein the second dopant is implanted into the polysilicon resistor bodies with a dose of 2E14/cm2 to 1E15/cm2 at an energy level of greater than 30 KeV.

12. The method as claimed in claim 10, wherein the second dopant is implanted into the polysilicon resistor bodies with a dose of 5E14/cm2 at an energy level of equal to or greater than 50 KeV.

13. The method as claimed in claim 9, further comprising:

forming a second polysilicon region including a plurality of polysilicon gates on the substrate in the active component area, wherein the polysilicon gates have the initial grain size;

implanting the polysilicon gates with the first dopant of the first conductivity type, and after the implanting, the polysilicon gates have a second grain size equal to the initial grain size; and performing the laser rapid thermal annealing process to the polysilicon gates.

14. The method as claimed in claim 13, further comprising:

forming a first mask to expose the first and second polysilicon regions for implanting the first dopant into the polysilicon resistor bodies and polysilicon gates; and forming a second mask to expose the first polysilicon region and cover the second polysilicon region for implanting the second dopant into the polysilicon resistor bodies.

15. The method as claimed in claim 9, further comprising forming a shallow trench isolation structure in the substrate, wherein the polysilicon resistors are formed on the shallow trench isolation structure.

* * * * *